United States Patent
Fowler et al.

(10) Patent No.: US 7,026,801 B2
(45) Date of Patent: Apr. 11, 2006

(54) GUARANTEED BOOTSTRAP HOLD-UP CIRCUIT FOR BUCK HIGH SIDE SWITCH

(75) Inventors: Thomas Lane Fowler, Garland, TX (US); David Gene Daniels, Dallas, TX (US); Alan Michael Johnson, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 158 days.

(21) Appl. No.: 10/662,558

(22) Filed: Sep. 15, 2003

(65) Prior Publication Data

US 2005/0057239 A1   Mar. 17, 2005

(51) Int. Cl.
*G05F 1/59* (2006.01)
(52) U.S. Cl. .............. 323/271; 323/285; 323/288; 323/901
(58) Field of Classification Search ............... 323/224, 323/225, 271, 282, 285, 288, 901
See application file for complete search history.

(56) References Cited

U.S. PATENT DOCUMENTS

| | | | | |
|---|---|---|---|---|
| 5,627,460 A | * | 5/1997 | Bazinet et al. | 323/288 |
| 6,037,760 A | * | 3/2000 | Borghi et al. | 323/282 |
| 6,172,493 B1 | * | 1/2001 | Grant | 323/288 |
| 6,489,758 B1 | * | 12/2002 | Moriconi et al. | 323/288 |
| 6,650,100 B1 | * | 11/2003 | Kohout et al. | 323/282 |
| 6,812,782 B1 | * | 11/2004 | Grant | 327/589 |
| 6,897,643 B1 | * | 5/2005 | Stone | 323/288 |

* cited by examiner

*Primary Examiner*—Jeffrey Sterrett
(74) *Attorney, Agent, or Firm*—W. Daniel Swayze, Jr.; W. James Brady; Frederick J. Telecky, Jr.

(57) ABSTRACT

A buck regulator switching power supply (10) selectively enabling a low side device to effectively recharge a bootstrap capacitor ($C_{boot}$) during a high duty cycle of operation. The switching power supply (10) includes a gate driver (12) driving a gate of a high side FET (Q1) responsive to a controller circuit (14). Controller circuit (14) includes a controller (16) responsively controlled by a comparator (18). Comparator (18) senses the charge of the charging side of the bootstrap capacitor ($C_{boot}$) as compared to a voltage ($V_{ref}$). The comparator (18) also responsively generates an output signal on an output line (20) as a function of the voltage at the phased output.

21 Claims, 1 Drawing Sheet

GUARANTEED BOOTSTRAP HOLD-UP CIRCUIT FOR BUCK HIGH SIDE SWITCH

FIELD OF THE INVENTION

The present invention is generally related to switching power supplies, and more particularly to buck regulator switching power supplies including those having a bootstrap capacitor.

BACKGROUND OF THE INVENTION

Buck regulator switching power supplies typically include a bootstrap capacitor used to boost a voltage at a gate of a high side MOSFET. The purpose of the bootstrap capacitor is to allow the high side MOSFET to be enhanced "on" since its gate voltage must be greater than the voltage normally available in the application.

In certain operating conditions, the bootstrap capacitor of the buck regulator switching power supply can lose its charge. When this happens, the power stage does not function properly, and in some circumstances, the power stage can latch "off".

There is desired an improved buck regulator switching power supply that ensures the bootstrap capacitor is properly recharged, particularly when the buck regulator switching power supply has a high duty cycle to provide large output voltages, including outputs very close to the input voltage.

SUMMARY OF THE INVENTION

The present invention achieves technical advantages as a buck regulator switching power supply ensuring the bootstrap capacitor is properly recharged, particularly during high duty cycles. One embodiment of the present invention includes a detector and controller sensing the voltage across the bootstrap capacitor, and selectively enabling a low side device to improve the charging of the bootstrap capacitor. In one embodiment, a comparator senses the voltage across the bootstrap capacitor, in reference to a voltage reference. A controller circuit including the comparator responsively enables a low side device to facilitate the recharging of the bootstrap capacitor when it is determined the voltage across the bootstrap capacitor is dropping or is becoming insufficient for suitable operation. The low side device may comprise a low side FET, whereby the source of this low side FET is connected to ground and selectively provides ground to the non-charging side of the bootstrap capacitor to improve the charging thereof, such as during high duty cycle conditions.

The present invention also includes a switch for selectively coupling the input voltage to the bootstrap capacitor during recharging thereof. The comparator circuit is also responsive to the phase output of the circuit, whereby a controller provides a gate drive signal to the high side FET as a function of the comparator output. The low side device is enabled anti-phase with the high side FET.

Advantageously, the present invention provides an input to output ratio of beyond 99%, dependent on charge leakage of the boot strap capacitor and highside driver. This is achieved because the low side device is not enabled every cycle and selectively recharges the bootstrap capacitor to ensure effective boosting at a high side FET.

DETAILED DESCRIPTION OF THE PREFERRED EMBODIMENT

Figure 1:
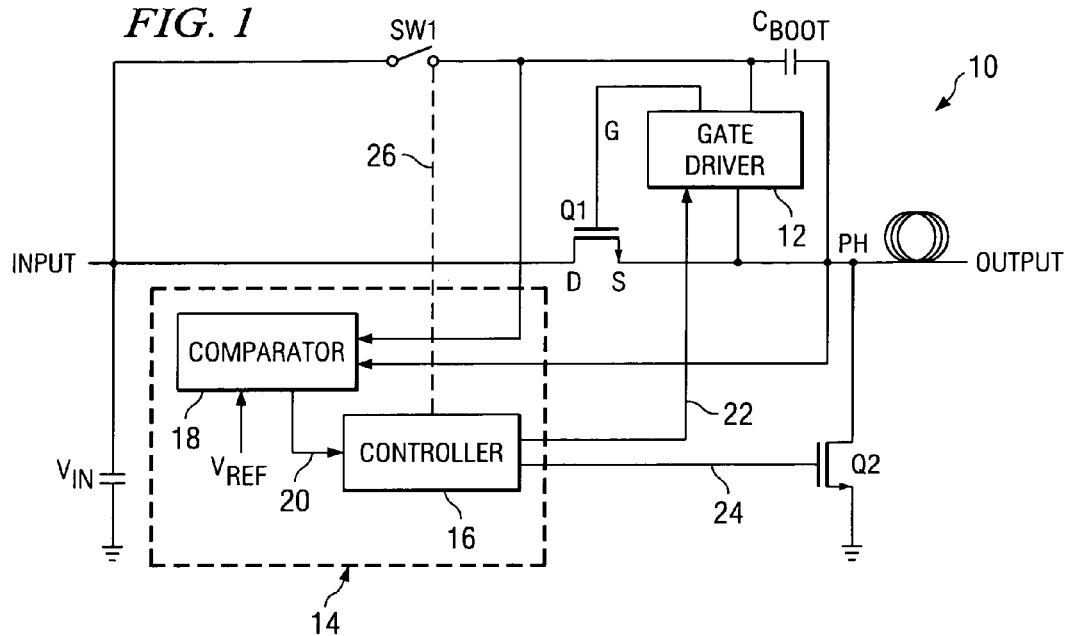
FIG. 1 is a schematic diagram of the present invention including a controller responsive to a comparator sensing the bootstrap capacitor voltage, and a low side FET selectively enabled by the controller during only some cycles to maintain a voltage at the bootstrap capacitor.

Referring now to FIG. 1, there is generally shown at 10 a buck regulator switching power supply according to the present invention. Power supply 10 is seen to include a gate driver circuit 12 selectively driving the gate of a high side FET transistor Q1. A controller circuit 14 is seen to control gate driver 12, as well as selectively driving the gate of a low side device, seen to comprise a low side FET Q2. Circuit 14 is seen to comprise a controller 16 generating the two output control signals, and responsively receiving an output signal from comparator 18.

According to the present invention, comparator 18 is coupled to and senses the voltage across the bootstrap capacitor, identified as $C_{boot}$. Comparator 18 compares this voltage across the bootstrap capacitor to a voltage reference provided thereto, and provides an output signal on line 20 which is indicative of whether the voltage of the $C_{boot}$ capacitor has fallen below the voltage reference provided to comparator 18. If so, controller 16 responsively responds to the output signal provided on line 20 to selectively enable the low side FET Q2 during the anti-phase of circuit 10, thereby facilitating the recharging of bootstrap capacitor $C_{boot}$.

When the duty cycle of power supply 10 is large, such that the output voltage at the circuit 10 output is desired to be substantially close to the voltage at the input of circuit 10, controller circuit 14 ensures the effectiveness of bootstrap capacitor $C_{boot}$ through the selective enabling of low side FET Q2. By selectively providing a ground to the non-charging side of bootstrap capacitor $C_{boot}$ during the anti-phase of circuit 10, the $C_{boot}$ capacitor is effectively recharged upon the closure of switch SW1 and an effective boost voltage is provided to high side FET Q1, particularly, during this high duty cycle.

Figure 2:
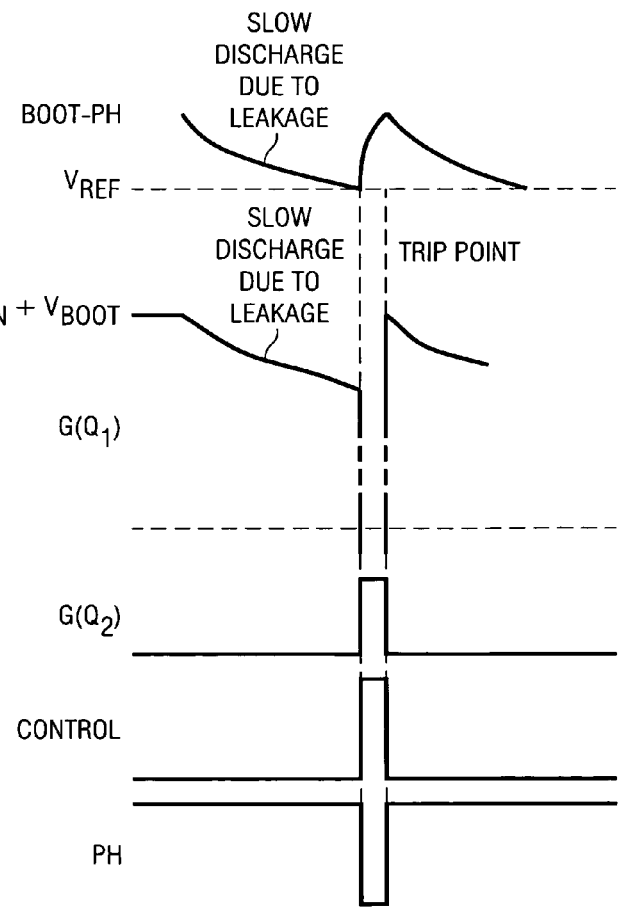
FIG. 2 is a waveform diagram illustrating the signals at various nodes of the circuit to achieve a high input to output voltage ratio.

Referring to FIG. 2, there is shown a timing diagram of the various signals at various nodes of circuit 10. It can be appreciated in FIG. 2 that the gate driver 12 effectively provides an effective boost voltage to bootstrap capacitor $C_{boot}$ even during a high duty cycle. The present invention achieves technical advantages by both driving the high side FET Q1 as a function of the sensed voltage of the bootstrap capacitor $C_{boot}$, and also by only enabling the low side device Q2 when needed to recharge bootstrap capacitor $C_{boot}$ to maintain its effectiveness, particularly during high duty cycle operation. As compared to prior art buck regulator switching power supplies which may oily achieve 92% efficiency, the present invention achieves approximately 99% efficiency by not enabling the low side FET Q2 every cycle. For instance, the low side FET Q2 may be enabled only once every 50 cycles. As also can be appreciated in FIG. 2, the comparator 18 provides an output control signal on line 20 as a function of the sensed charged voltage of bootstrap capacitor $C_{boot}$, and the sensed voltage at the phased output as a function of the voltage provided to the voltage reference.

Referring back to FIG. 1, if the output of controller 16 on line 22 is high, the gate of the high side FET Q1 is connected to the charged side of bootstrap capacitor $C_{boot}$ via the gate driver circuit 12. This provides the bootstrap effect, and the gate of high side FET Q1 remains connected to capacitor $C_{boot}$ when switch SW1 is on to refresh the $C_{boot}$ capacitor, and thus which becomes the input voltage $V_{in}$.

When the output of controller 16 provides a low signal on control line 22, the gate driver circuit 12 pulls the gate of high side FET Q1 to the phased output node PH, which responsively turns off the high side FET Q1 and the phase node PH goes to low.

Low side FET Q2 is only switched on during the anti-phase of high side FET Q1. When low side FET Q2 is enabled via control line 24, the ground is connected to the non-charging side of bootstrap capacitor $C_{boot}$ and controller 16 closes switch SW1 via control line 26. This arrangement effectively provides a voltage differential of $V_{in}$ across bootstrap capacitor $C_{boot}$ such that the bootstrap capacitor is effective, even during duty cycles approaching 99%. Advantageously, low side FET Q2 is only selectively turned on during high duty cycles, and may be on only once every 50 cycles.

The present invention is also particularly useful in low voltage applications when the output voltage needs to be substantially close to the input voltage, and provides a cost effective solution.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications. For instance, low side FET Q2 could be substituted with a bipolar device, or another suitable switching component to achieve the same function of ensuring the effectiveness of the bootstrap capacitor $C_{boot}$.

We claim:

1. A buck regulator switching power supply, comprising a switching power supply circuit having an input and an output, a high side FET and a low side device, a bootstrap capacitor coupled to the high side FET;
further comprising a controller coupled to and sensing a voltage of the bootstrap capacitor, the controller selectively recharging the bootstrap capacitor as a function of the sensed bootstrap capacitor voltage, and
further the controller selectively controlling the low side device as a function of the sensed bootstrap capacitor voltage independently of the high side device.

2. The switching power supply as specified in claim 1 wherein the bootstrap capacitor is selectively recharged when the bootstrap capacitor become less effective due to a high duty cycle of the switching power supply.

3. The switching power supply as specified in claim 1 wherein the low side device is a FET.

4. The switching power supply as specified in claim 3 wherein the low side device is a switching device.

5. The switching power supply as specified in claim 3 further comprising a gate driver controllably driving the high side FET as a function of the controller.

6. The switching power supply as specified in claim 5 wherein the low side device is enabled anti-phase with the highside FET.

7. The switching power supply as specified in claim 6 wherein the low side device is a FET.

8. The switching power supply as specified in claim 6 wherein the controller also controllably drives the high side FET as a function of a voltage at the output.

9. The switching power supply as specified in claim 5 wherein the controller also couples a charged side of the bootstrap capacitor to the high side FET gate when driving the high side FET.

10. The switching power supply as specified in claim 9 further comprising a switch selectively coupling the input to the charging side of the bootstrap capacitor during a charging cycle.

11. The switching power supply as specified in claim 9 wherein the controller couples the non-charging side of the bootstrap capacitor to ground during charging of the bootstrap capacitor.

12. The switching power supply as specified in claim 1, wherein the controller comprises a comparator.

13. The switching power supply as specified in claim 12 wherein the comparator compares the bootstrap capacitor voltage to a reference voltage.

14. The switching power supply as specified in claim 1 wherein an input to output ratio of the switching power supply is at least 95%.

15. The switching power supply as specified in claim 14 wherein the ratio is at least 97%.

16. The switching power supply as specified in claim 15 wherein the ratio is about 99%.

17. A method of operating a buck regulator switching power supply, comprising the steps of:
sensing a voltage of a bootstrap capacitor; and
selectively recharging the bootstrap capacitor as a function of the sensed bootstrap capacitor voltages,
wherein the switching power supply has a high side FET and a low side device, wherein the low side device is enabled to selectively recharge the bootstrap capacitor as a function of the sensed bootstrap capacitor voltage independently of the high side device.

18. The method as specified in claim 17 wherein the low side device is enabled to selectively recharge the bootstrap capacitor when the bootstrap capacitor becomes discharged and hence less effective due to a high duty cycle of the switching power supply.

19. The method as specified in claim 18 wherein the switching power supply has an input to output ratio of greater than 95%.

20. The method as specified in claim 19 wherein the switching power supply ratio is greater than 97%.

21. The method as specified in claim 20 wherein the switching power supply ratio is approximately 99%.

* * * * *